(12) United States Patent
Blas Martinez et al.

(10) Patent No.: US 10,697,343 B2
(45) Date of Patent: Jun. 30, 2020

(54) METHODS AND SYSTEMS FOR THERMOELECTRICALLY RECOVERING WASTE HEAT FROM TURBOCHARGER SYSTEMS

(71) Applicant: Ford Global Technologies, LLC, Dearborn, MI (US)

(72) Inventors: Luis Felipe Blas Martinez, Jilotepec (MX); Miguel Angel Leon Guerrero, Ecatepec de Morelos (MX); Enrique Lopez Hernandez, Toluca (MX); Ricardo Daniel Sanchez Lugo, Texcoco (MX); Francisco Javier Gomez Mata, Cuajimalpa de Morelos (MX); Christopher Diaz Rodriguez, Bosques de Aragon (MX)

(73) Assignee: Ford Global Technologies, LLC, Dearborn, MI (US)

( * ) Notice: Subject to any disclaimer, the term of this patent is extended or adjusted under 35 U.S.C. 154(b) by 73 days.

(21) Appl. No.: 15/937,675

(22) Filed: Mar. 27, 2018

(65) Prior Publication Data
US 2019/0301338 A1    Oct. 3, 2019

(51) Int. Cl.
| | | |
|---|---|---|
| F01N 5/02 | (2006.01) | |
| F01N 13/10 | (2010.01) | |
| F02F 1/40 | (2006.01) | |
| H01L 35/02 | (2006.01) | |

(52) U.S. Cl.
CPC .......... *F01N 5/025* (2013.01); *F01N 13/102* (2013.01); *F02F 1/40* (2013.01); *H01L 35/02* (2013.01)

(58) Field of Classification Search
CPC combination set(s) only.
See application file for complete search history.

(56) References Cited

U.S. PATENT DOCUMENTS

| | | | |
|---|---|---|---|
| 5,625,245 A * | 4/1997 | Bass | H01L 35/00 310/306 |
| 8,650,865 B2 * | 2/2014 | Neugebauer | F01N 5/025 136/208 |
| 9,097,121 B2 | 8/2015 | Joergl et al. | |
| 9,761,781 B2 | 9/2017 | Sui et al. | |
| (Continued) | | | |

FOREIGN PATENT DOCUMENTS

| | | |
|---|---|---|
| CN | 103147879 A | 6/2013 |
| DE | 102009036749 A1 | 2/2011 |
| (Continued) | | |

OTHER PUBLICATIONS

Brignone, M. et al., "Impact of Novel Thermoelectric Materials on Automotive Applications," Proceedings of the 9th European Conference on Thermoelectrics (ECT2011), Sep. 28, 2011, Thessaloniki, Greece, 4 pages.

(Continued)

*Primary Examiner* — Binh Q Tran
(74) *Attorney, Agent, or Firm* — Geoffrey Brumbaugh; McCoy Russell LLP

(57) ABSTRACT

Methods and systems are provided for using thermoelectric generators to recover waste heat from and diagnose turbocharger systems. In one example, a method may include adjusting one or more engine operating parameters based on an amount of current generated from one or more thermoelectric generators coupled to a turbocharger.

17 Claims, 7 Drawing Sheets

(56) References Cited

U.S. PATENT DOCUMENTS

| | | | |
|---|---|---|---|
| 9,790,844 B2 | 10/2017 | Yang | |
| 10,125,636 B2* | 11/2018 | Dube | F02C 3/04 |
| 2011/0016888 A1 | 1/2011 | HaaB et al. | |
| 2012/0055527 A1 | 3/2012 | Zika-Beyerlein | |
| 2012/0204557 A1* | 8/2012 | Jebasinski | F01N 13/10 60/605.1 |
| 2013/0000285 A1 | 1/2013 | Prior | |
| 2014/0007915 A1 | 1/2014 | Koehne | |
| 2014/0238459 A1 | 8/2014 | Moors et al. | |
| 2015/0040544 A1 | 2/2015 | An et al. | |
| 2015/0214458 A1* | 7/2015 | Nandigama | F02B 29/0406 60/599 |
| 2015/0243870 A1 | 8/2015 | Kushch | |
| 2017/0074157 A1* | 3/2017 | Mitkari | F02B 37/005 |

FOREIGN PATENT DOCUMENTS

| | | |
|---|---|---|
| EP | 2818657 A1 | 12/2014 |
| WO | 2015057399 A1 | 4/2015 |

OTHER PUBLICATIONS

"Part # CMO-25-42S Product Sheet," TEC Solidstate Power Generators, Available Online at http://thermoelectric-generator.com/wp-content/uploads/2014/04/CMO-25-42S-OXIDE-NEW.pdf, Apr. 2014, 3 pages.

"Part # CMO-32-62S Product Sheet," TEC Solidstate Power Generators, Available Online at http://thermoelectric-generator.com/wp-content/uploads/2014/04/CMO-32-62S-OXIDE-ONLY-new.pdf, Apr. 2014, 3 pages.

"Part # CMO-32-62S Cascade Product Sheet," TEC Solidstate Power Generators, Available Online at http://thermoelectric-generator.com/wp-content/uploads/2014/04/CMO-32-62S-Cascade-2014-TECTEG-NEW.pdf, Apr. 2014, 3 pages.

Meng, J. et al., Performance investigation and design optimization of a thermoelectric generator applied in automobile exhaust waste heat recovery, Energy Conversion and Management, vol. 120, Jul. 15, 2016, Available Online Apr. 28, 2016, 10 pages.

He, W. et al., "Optimal Heat Exchanger Dimensional Analysis under Different Automobile Exhaust Temperatures for Thermoelectric Generator System," Energy Procedia, vol. 104, Dec. 2016, Previously presented in Proceedings of CUE2016—Applied Energy Symposium and Forum 2016: Low carbon cities & urban energy systems, Jun. 13, 2016, Jinan, Shandong, China, 6 pages.

Orr, B. et al., "An exhaust heat recovery system utilising thermoelectric generators and heat pipes," Applied Thermal Engineering, vol. 126, Nov. 5, 2017, Available Online Nov. 4, 2016, 6 pages.

Champier, D., "Thermoelectric generators: A review of applications," Energy Conversion and Management, vol. 140, May 15, 2017, Available Online Mar. 8, 2017, 15 pages.

* cited by examiner

METHODS AND SYSTEMS FOR THERMOELECTRICALLY RECOVERING WASTE HEAT FROM TURBOCHARGER SYSTEMS

FIELD

The present description relates generally to methods and systems for energy generation in a vehicle, and more specifically to methods and systems for recovering waste heat and diagnosing turbocharger systems with thermoelectric generators.

BACKGROUND/SUMMARY

To reduce engine fuel consumption and emissions, vehicles are continually being adapted to operate more efficiently. One mechanism to improve vehicle efficiency includes operating certain accessory components of the vehicle, such as air conditioning compressors, electrically instead of mechanically via the engine of the vehicle. However, the additional electrical load on the vehicle frequently necessitates electricity generation via the vehicle alternator, which may degrade fuel consumption and emissions.

Various approaches to generating electricity onboard a vehicle have been proposed. In one example shown by Mitkari et al. in U.S. Patent Application Publication No. 2017/0074157, thermoelectric generators are coupled to a wastegate enclosure of a turbocharger turbine. The thermoelectric generators generate electricity via heat flux from a high temperature region (the wastegate enclosure) to a low temperature region (a coolant supply), and the electricity may be used by accessory components or stored in a battery.

However, the inventors herein have recognized some issues with the above approach. Due to the positioning of the wastegate enclosure, the additional coolant supply is required to generate a sufficient temperature differential across the thermoelectric generators. The provision of the additional coolant supply may increase the cost and complexity of such a system. Further, only a portion of the exhaust gas from the engine may flow through the wastegate, and only at certain operating conditions, such as high load conditions, and thus the system of Mitkari fails to take advantage of other sources of waste heat in the exhaust system. Further still, Mitkari fails to recognize that because the thermoelectric generators generate current in proportion to the temperature differential across the thermoelectric generators, the presence of the thermoelectric generators in certain locations of the vehicle presents an opportunity to utilize the thermoelectric generators as sensors to monitor performance of some vehicle or engine components.

Accordingly, the inventors herein provide an approach to at least partly address the above issues. In one example, a method includes adjusting one or more engine operating parameters based on an amount of current generated from one or more thermoelectric generators coupled to a turbocharger. In this way, the amount of current generated by the one or more thermoelectric generators may be monitored to determine if the temperature differential across the thermoelectric generators corresponds to an expected temperature differential. In one example, because the thermoelectric generators are coupled to a turbocharger, the expected temperature differential may reflect an expected temperature of a turbine of the turbocharger. If the amount of current generated by the one or more thermoelectric generators is greater than expected, a greater than expected temperature differential may be indicated that reflects a high turbine temperature. In response to the high turbine temperature, a wastegate position may be adjusted to direct high temperature exhaust gas away from the turbine and/or engine torque may be limited to reduce exhaust gas mass flow and temperature.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

Figure 2:
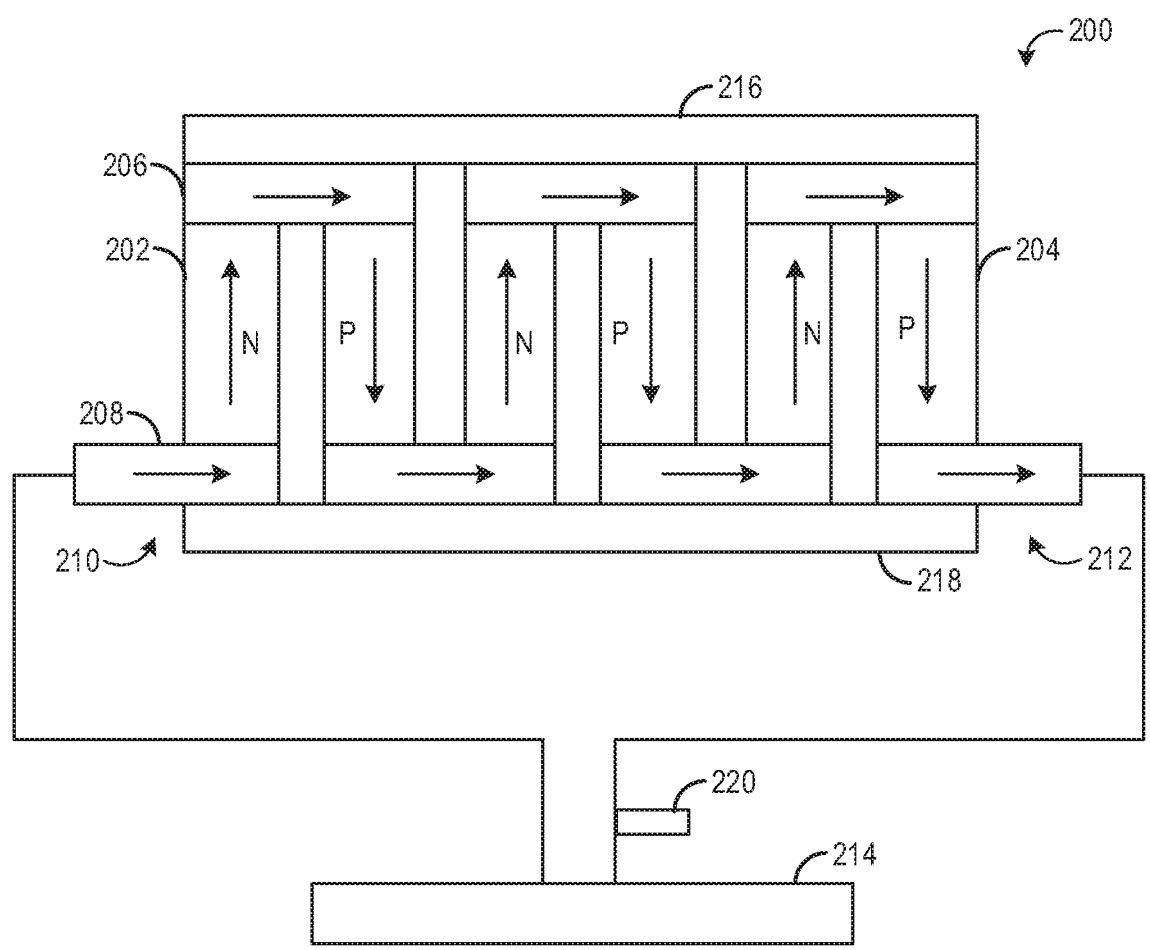
FIG. 2 schematically shows an example thermoelectric generator (TEG).
Figure 3:
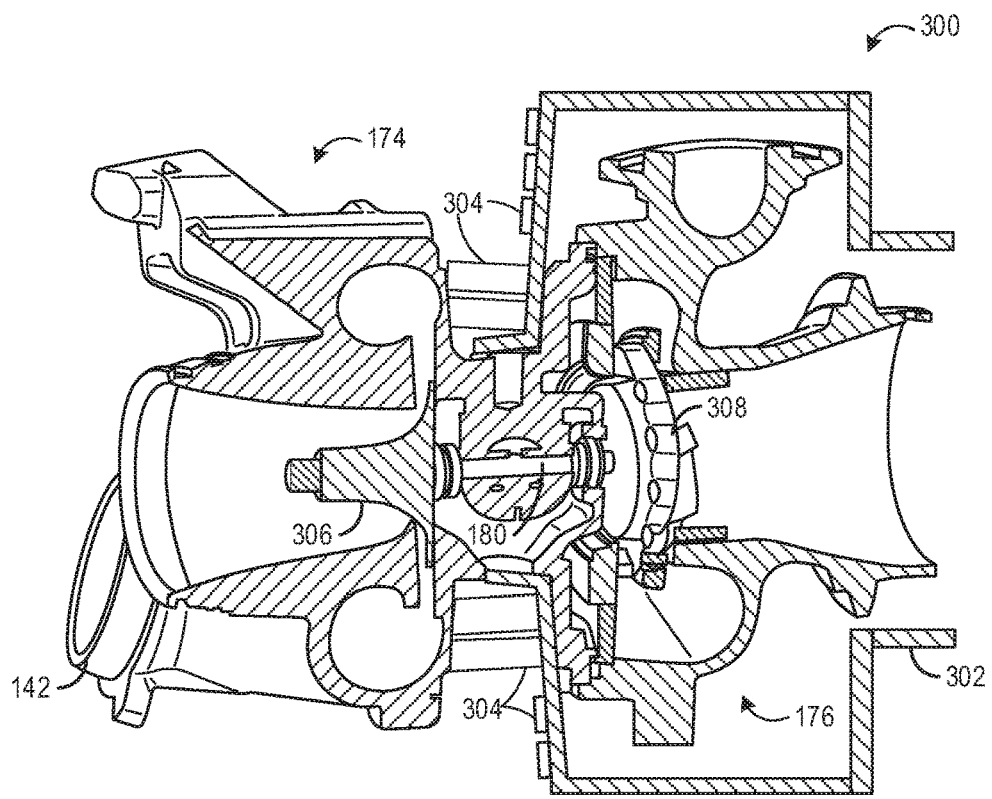
FIG. 3 schematically shows a first example turbocharger system with TEGs mounted on an exhaust turbine.
Figure 4:
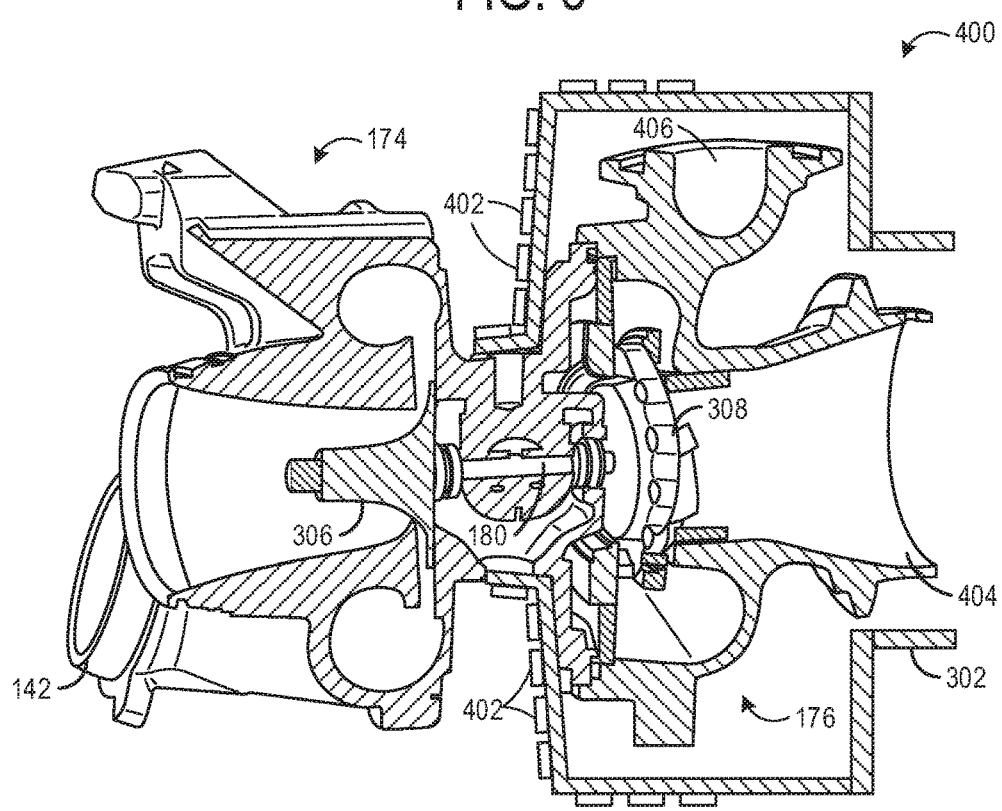
FIG. 4 schematically shows a second example turbocharger system with TEGs mounted on the exhaust turbine.
Figure 5:
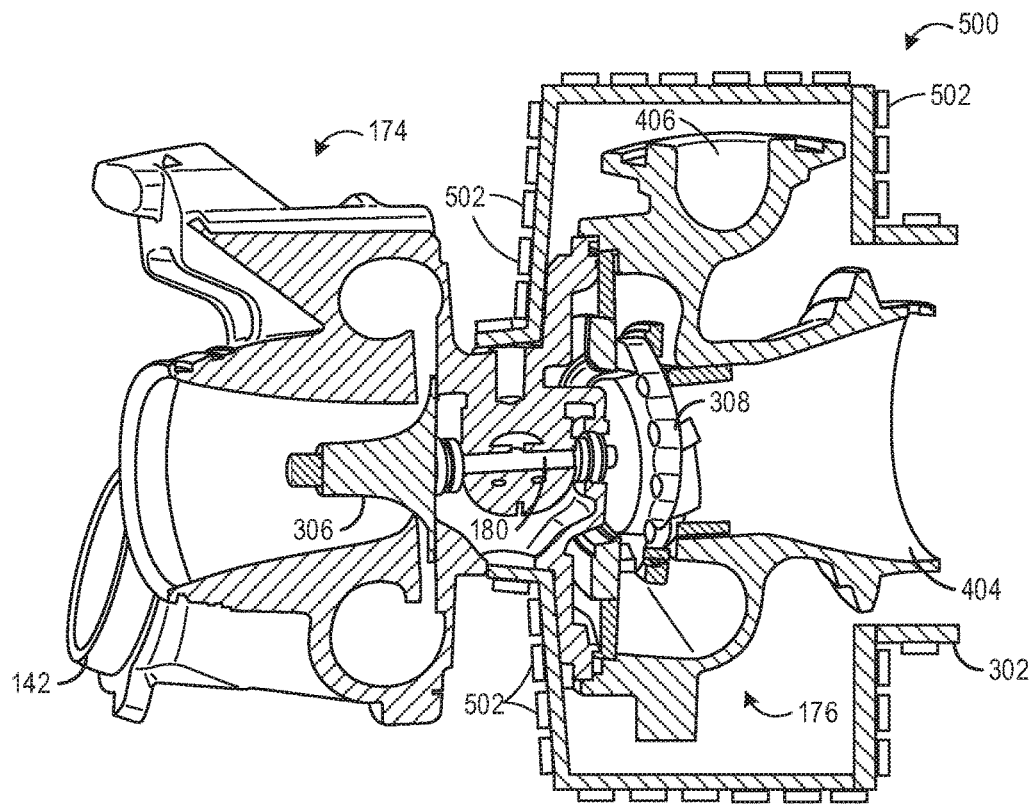
FIG. 5 schematically shows a third example turbocharger system with TEGs mounted on the exhaust turbine.
Figure 6:
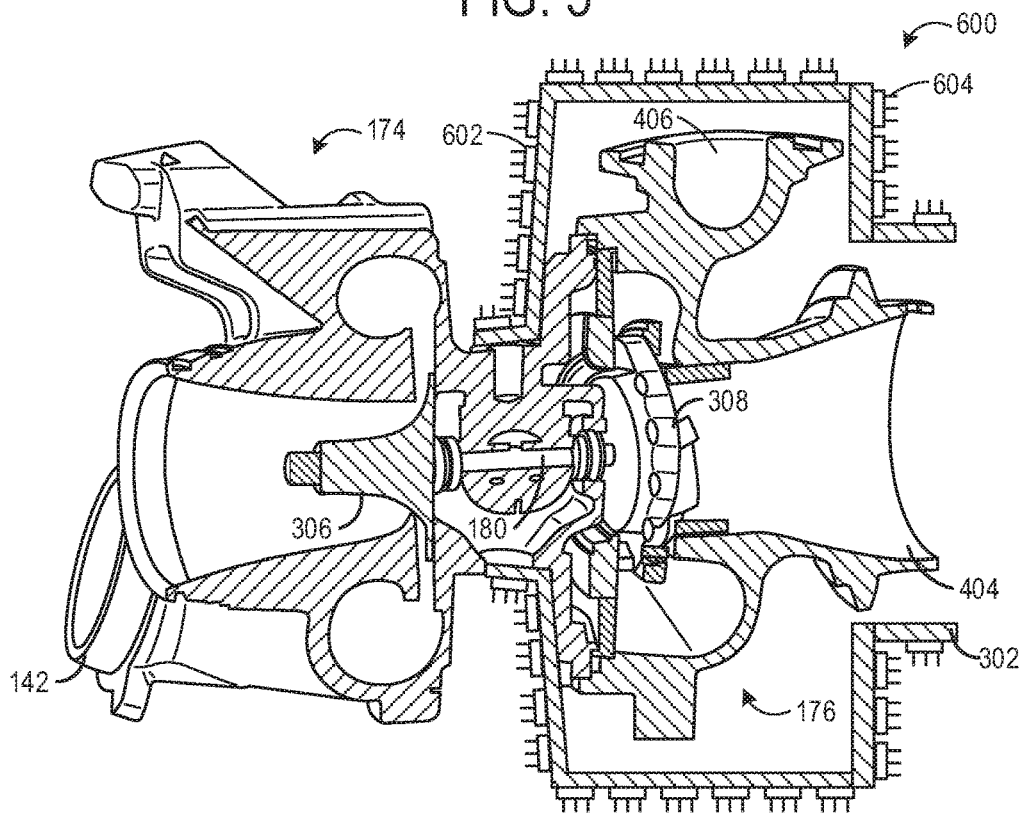
FIG. 6 schematically shows a fourth example turbocharger system with TEGs mounted on entire exhaust turbine.
Figure 7A:
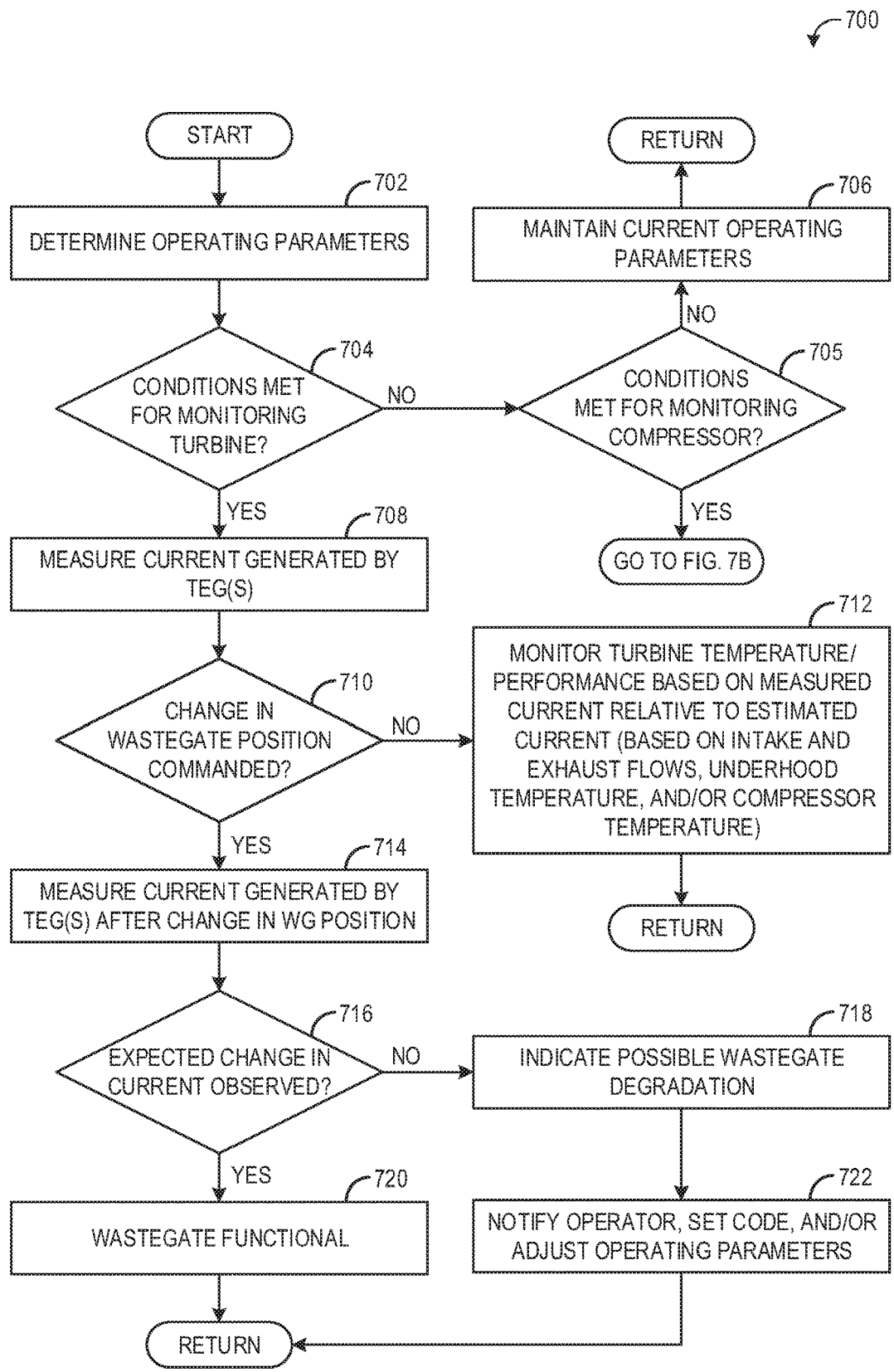
FIGS. 7A-7B show a flow chart illustrating a method for utilizing TEGs to monitor a temperature of an exhaust turbine and/or compressor and perform diagnostics on the turbine, the compressor, an e-booster, and/or a wastegate.
Figure 7B:
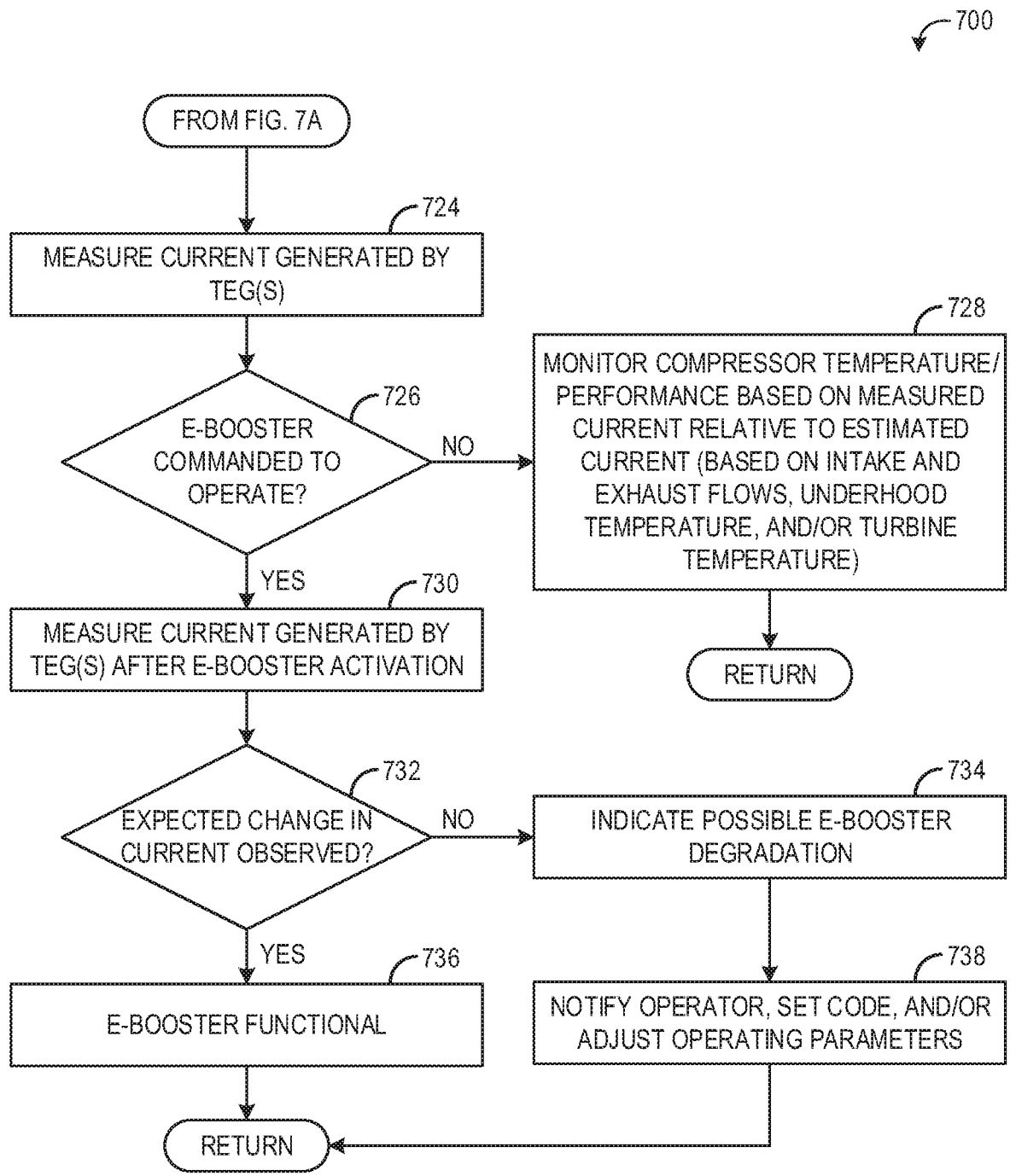

The following description relates to systems and methods for thermoelectrically recovering waste heat from the exhaust turbine in a turbocharger system in a vehicle. The following description also relates to systems and methods for utilizing thermoelectric generators mounted on the exhaust turbine to monitor and diagnose performance of the exhaust turbine, wastegate, compressor, and/or e-booster auxiliary supercharger system. The use of thermoelectric generators mounted on exhaust turbine housing of an exhaust turbine in a turbocharger system may be implemented in a vehicle system, such as the vehicle system shown in FIG. 1. A thermoelectric generator (TEG) is shown in FIG. 2. A first configuration of TEGs mounted on the exhaust turbine housing, with some TEGs directly in contact with the compressor and others in contact with ambient air is shown in FIG. 3. A second configuration of TEGs mounted partially around the exhaust turbine housing is shown in FIG. 4. A third configuration of TEGs mounted completely around the exhaust turbine housing is shown in FIG. 5. A fourth configuration of TEGs mounted completely around the exhaust turbine with additional thermally conductive cooling fins is shown in FIG. 6. A method for monitoring and diagnosing the exhaust turbine and wastegate with TEGs and for monitoring and diagnosing the compressor and e-booster with TEGs is shown in FIGS. 7A-7B. Operating parameters that may be observed during the execution of the method of FIGS. 7A-7B are shown in the timing diagram of FIG. 8.

Figure 1:
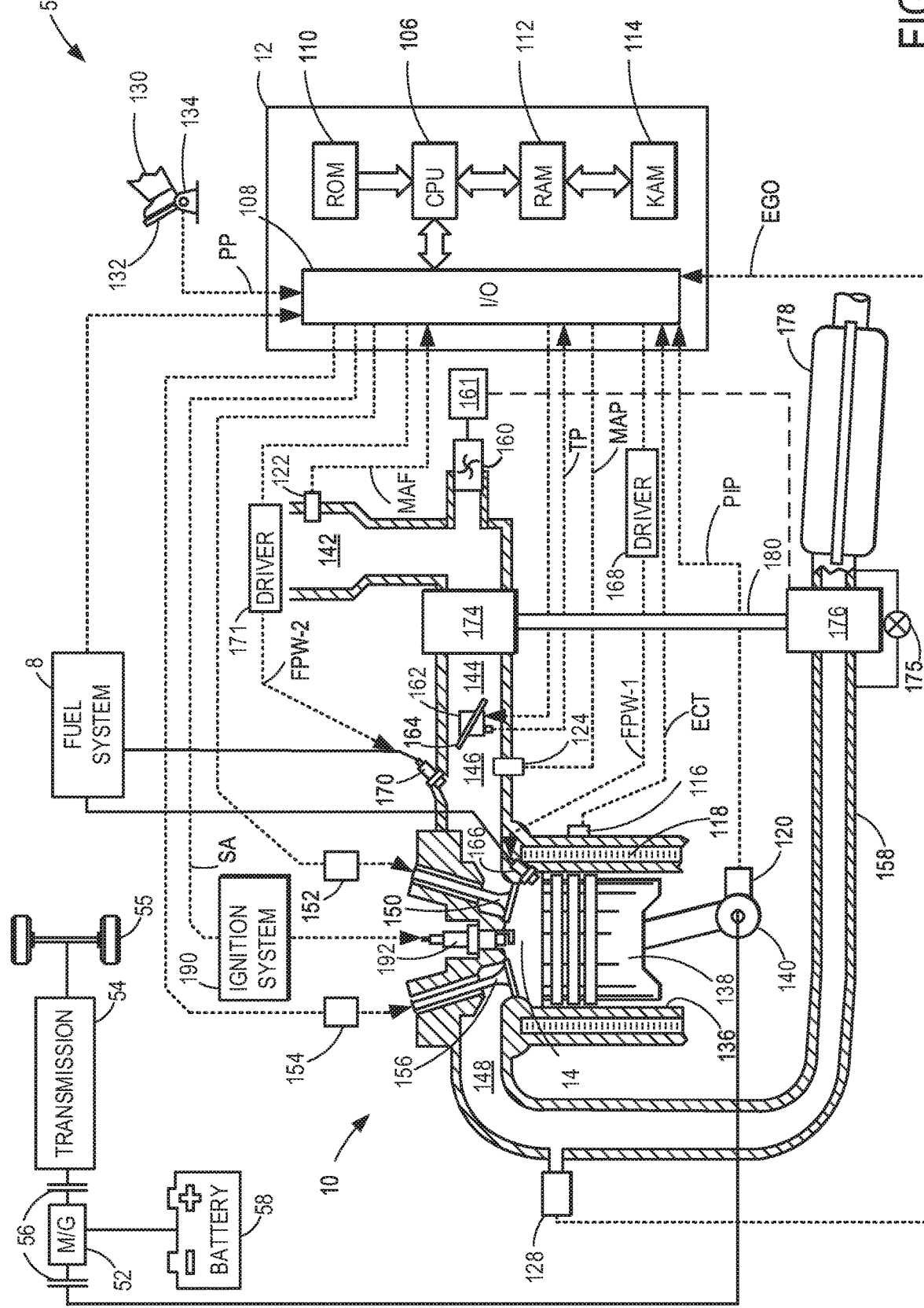
FIG. 1 schematically shows an example vehicle and vehicle engine system.

Turning now to FIG. 1, an example of a cylinder 14 of an internal combustion engine 10 is illustrated, which may be included in a vehicle 5. Engine 10 may be controlled at least partially by a control system, including a controller 12, and by input from a vehicle operator 130 via an input device 132. In this example, input device 132 includes an accelerator pedal and a pedal position sensor 134 for generating a proportional pedal position signal PP. Cylinder (herein, also "combustion chamber") 14 of engine 10 may include combustion chamber walls 136 with a piston 138 positioned therein. Piston 138 may be coupled to a crankshaft 140 so that reciprocating motion of the piston is translated into rotational motion of the crankshaft. Crankshaft 140 may be coupled to at least one drive wheel 55 of the passenger vehicle via a transmission 54, as described further below. Further, a starter motor (not shown) may be coupled to crankshaft 140 via a flywheel to enable a starting operation of engine 10.

In some examples, vehicle 5 may be a hybrid vehicle with multiple sources of torque available to one or more vehicle wheels 55. In other examples, vehicle 5 is a conventional vehicle with only an internal combustion engine. In the example shown, vehicle 5 includes engine 10 and an electric machine 52. Electric machine 52 may be a motor or a motor/generator. Crankshaft 140 of engine 10 and electric machine 52 are connected via transmission 54 to vehicle wheels 55 when one or more clutches 56 are engaged. In the depicted example, a first clutch 56 is provided between crankshaft 140 and electric machine 52, and a second clutch 56 is provided between electric machine 52 and transmission 54. Controller 12 may send a signal to an actuator of each clutch 56 to engage or disengage the clutch, so as to connect or disconnect crankshaft 140 from electric machine 52 and the components connected thereto, and/or connect or disconnect electric machine 52 from transmission 54 and the components connected thereto. Transmission 54 may be a gearbox, a planetary gear system, or another type of transmission. The powertrain may be configured in various manners including as a parallel, a series, or a series-parallel hybrid vehicle.

Electric machine 52 receives electrical power from a traction battery 58 to provide torque to vehicle wheels 55. Electric machine 52 may also be operated as a generator to provide electrical power to charge battery 58, for example, during a braking operation.

Cylinder 14 of engine 10 can receive intake air via a series of intake air passages 142, 144, and 146. Intake air passage 146 can communicate with other cylinders of engine 10 in addition to cylinder 14. In some examples, one or more of the intake passages may include a boosting device, such as a turbocharger or a supercharger. For example, FIG. 1 shows engine 10 configured with a turbocharger, including a compressor 174 arranged between intake passages 142 and 144 and an exhaust turbine 176 arranged along an exhaust passage 148. Compressor 174 may be at least partially powered by exhaust turbine 176 via a shaft 180 when the boosting device is configured as a turbocharger. However, in other examples, such as when engine 10 is provided with a supercharger, compressor 174 may be powered by mechanical input from a motor or the engine and exhaust turbine 176 may be optionally omitted.

In a further example, engine 10 may include a wastegate 175, which allows exhaust from the engine to bypass the exhaust turbine 176 and proceed to the emission control device 178. The wastegate allows the maximum exhaust turbine speed to be controlled, which moderates the maximum boost pressure inside the intake passage 144 generated by compressor 174. The wastegate also protects the turbocharger system and vehicle engine from unnecessary wear, due to the wastegate allowing temperatures and turbine speed to be reduced by bypassing engine exhaust.

In some examples, engine 10 includes an electric compressor 160 defining a supercharger "e-booster" staged upstream of compressor 174. Herein, the supercharger is an auxiliary boosting device and the turbocharger is a primary boosting device, although other configurations may be possible. For example, in alternate embodiments, the turbocharger may be an electric turbocharger having an electric motor coupled to the compressor, turbine, or turbocharger shaft while the supercharger is configured as an electrical or mechanical supercharger. In still other examples, both the boosting devices may be electric superchargers or electric turbochargers.

Electric compressor 160 is driven by electric motor 161 along a supercharger compressor shaft. The electric motor may be powered by an on-board energy storage device, such as battery 58. Additionally or alternatively, electric motor 161 may be powered directly from one or more thermoelectric generators coupled to turbine 176, which are described in more detail below. An amount of electrical power delivered to electric motor 161 may be varied in order to adjust a duty cycle of the supercharger. In one example, the amount of electric power delivered to electric motor 161 may be increased to increase the speed of electric compressor 160. As a result of the electrical assistance, the supercharger may be rapidly spun up, providing for a fast-acting or high frequency boost actuation. During certain conditions (such as during a tip-in), electric motor 161 may be operated to rotate electric compressor 160 in a forward direction to provide boost assist.

A throttle 162 including a throttle plate 164 may be provided in the engine intake passages for varying the flow rate and/or pressure of intake air provided to the engine cylinders. For example, throttle 162 may be positioned downstream of compressor 174, as shown in FIG. 1, or may be alternatively provided upstream of compressor 174.

Exhaust passage 148 can receive exhaust gases from other cylinders of engine 10 in addition to cylinder 14. An exhaust gas sensor 128 is shown coupled to exhaust passage 148 upstream of an emission control device 178. Exhaust gas sensor 128 may be selected from among various suitable sensors for providing an indication of exhaust gas air/fuel ratio (AFR), such as a linear oxygen sensor or UEGO (universal or wide-range exhaust gas oxygen), a two-state oxygen sensor or EGO (as depicted), a HEGO (heated EGO), a NOx, a HC, or a CO sensor, for example. Emission control device 178 may be a three-way catalyst, a NOx trap, various other emission control devices, or combinations thereof.

Each cylinder of engine 10 may include one or more intake valves and one or more exhaust valves. For example, cylinder 14 is shown including at least one intake poppet valve 150 and at least one exhaust poppet valve 156 located at an upper region of cylinder 14. In some examples, each cylinder of engine 10, including cylinder 14, may include at least two intake poppet valves and at least two exhaust poppet valves located at an upper region of the cylinder. Intake valve 150 may be controlled by controller 12 via an actuator 152. Similarly, exhaust valve 156 may be controlled by controller 12 via an actuator 154. The positions of intake valve 150 and exhaust valve 156 may be determined by respective valve position sensors (not shown).

During some conditions, controller 12 may vary the signals provided to actuators 152 and 154 to control the opening and closing of the respective intake and exhaust valves. The valve actuators may be of an electric valve actuation type, a cam actuation type, or a combination thereof. The intake and exhaust valve timing may be controlled via variable intake cam timing, variable exhaust cam timing, dual independent variable cam timing, or fixed cam timing. Each cam actuation system may include one or more cams and may utilize one or more of cam profile switching (CPS), variable cam timing (VCT), variable valve timing (VVT), and/or variable valve lift (VVL) systems that may be operated by controller 12 to vary valve operation. For example, cylinder 14 may alternatively include an intake valve controlled via electric valve actuation and an exhaust valve controlled via cam actuation, including CPS and/or VCT. In other examples, the intake and exhaust valves may be controlled by a common valve actuator (or actuation system) or a variable valve timing actuator (or actuation system).

Cylinder 14 may have a compression ratio, which is a ratio of volumes when piston 138 is at bottom dead center (BDC) to top dead center (TDC). In one example, the compression ratio is in the range of 9:1 to 10:1. However, in some examples where different fuels are used, the compression ratio may be increased. This may happen, for example, when higher octane fuels or fuels with higher latent enthalpy of vaporization are used. The compression ratio may also be increased if direct injection is used due to its effect on engine knock.

In some examples, each cylinder of engine 10 may include a spark plug 192 for initiating combustion. An ignition system 190 can provide an ignition spark to combustion chamber 14 via spark plug 192 in response to a spark advance signal SA from controller 12, under select operating modes. A timing of signal SA may be adjusted based on engine operating conditions and driver torque demand. For example, a spark may be provided at maximum brake torque (MBT) timing to maximize engine power and efficiency. Controller 12 may input engine operating conditions, including engine speed, engine load, and exhaust gas AFR, into a look-up table and output the corresponding MBT timing for the input engine operating conditions. In other examples the engine may ignite the charge by compression as in a diesel engine.

In some examples, each cylinder of engine 10 may be configured with one or more fuel injectors for providing fuel thereto. As a non-limiting example, cylinder 14 is shown including a fuel injector 166. Fuel injector 166 may be configured to deliver fuel received from a fuel system 8. Fuel system 8 may include one or more fuel tanks, fuel pumps, and fuel rails. Fuel injector 166 is shown coupled directly to cylinder 14 for injecting fuel directly therein in proportion to the pulse width of a signal FPW-1 received from controller 12 via an electronic driver 168. In this manner, fuel injector 166 provides what is known as direct injection (hereafter also referred to as "DI") of fuel into cylinder 14. While FIG. 1 shows fuel injector 166 positioned to one side of cylinder 14, fuel injector 166 may alternatively be located overhead of the piston, such as near the position of spark plug 192. Such a position may increase mixing and combustion when operating the engine with an alcohol-based fuel due to the lower volatility of some alcohol-based fuels. Alternatively, the injector may be located overhead and near the intake valve to increase mixing. Fuel may be delivered to fuel injector 166 from a fuel tank of fuel system 8 via a high pressure fuel pump and a fuel rail. Further, the fuel tank may have a pressure transducer providing a signal to controller 12.

Fuel injector 170 is shown arranged in intake passage 146, rather than in cylinder 14, in a configuration that provides what is known as port fuel injection (hereafter referred to as "PFI") into the intake port upstream of cylinder 14. Fuel injector 170 may inject fuel, received from fuel system 8, in proportion to the pulse width of signal FPW-2 received from controller 12 via electronic driver 171. Note that a single driver 168 or 171 may be used for both fuel injection systems, or multiple drivers, for example driver 168 for fuel injector 166 and driver 171 for fuel injector 170, may be used, as depicted.

In an alternate example, each of fuel injectors 166 and 170 may be configured as direct fuel injectors for injecting fuel directly into cylinder 14. In still another example, each of fuel injectors 166 and 170 may be configured as port fuel injectors for injecting fuel upstream of intake valve 150. In yet other examples, cylinder 14 may include only a single fuel injector that is configured to receive different fuels from the fuel systems in varying relative amounts as a fuel mixture, and is further configured to inject this fuel mixture either directly into the cylinder as a direct fuel injector or upstream of the intake valves as a port fuel injector.

Fuel may be delivered by both injectors to the cylinder during a single cycle of the cylinder. For example, each injector may deliver a portion of a total fuel injection that is combusted in cylinder 14. Further, the distribution and/or relative amount of fuel delivered from each injector may vary with operating conditions, such as engine load, knock, and exhaust temperature, such as described herein below. The port injected fuel may be delivered during an open intake valve event, closed intake valve event (e.g., substantially before the intake stroke), as well as during both open and closed intake valve operation. Similarly, directly injected fuel may be delivered during an intake stroke, as well as partly during a previous exhaust stroke, during the intake stroke, and partly during the compression stroke, for example. As such, even for a single combustion event, injected fuel may be injected at different timings from the port and direct injector. Furthermore, for a single combustion event, multiple injections of the delivered fuel may be performed per cycle. The multiple injections may be performed during the compression stroke, intake stroke, or any appropriate combination thereof.

Fuel injectors 166 and 170 may have different characteristics. These include differences in size, for example, one injector may have a larger injection hole than the other. Other differences include, but are not limited to, different spray angles, different operating temperatures, different targeting, different injection timing, different spray characteristics, different locations etc. Moreover, depending on the distribution ratio of injected fuel among injectors 170 and 166, different effects may be achieved.

Fuel tanks in fuel system 8 may hold fuels of different fuel types, such as fuels with different fuel qualities and different fuel compositions. The differences may include different alcohol content, different water content, different octane, different heats of vaporization, different fuel blends, and/or combinations thereof etc. One example of fuels with different heats of vaporization could include gasoline as a first fuel type with a lower heat of vaporization and ethanol as a second fuel type with a greater heat of vaporization. In another example, the engine may use gasoline as a first fuel type and an alcohol containing fuel blend such as E85 (which is approximately 85% ethanol and 15% gasoline) or M85 (which is approximately 85% methanol and 15% gasoline) as a second fuel type. Other feasible substances include water, methanol, a mixture of alcohol and water, a mixture of water and methanol, a mixture of alcohols, etc.

Controller 12 is shown in FIG. 1 as a microcomputer, including a microprocessor unit 106, input/output ports 108, an electronic storage medium for executable programs (e.g., executable instructions) and calibration values shown as non-transitory read-only memory chip 110 in this particular example, random access memory 112, keep alive memory 114, and a data bus. Controller 12 may receive various signals from sensors coupled to engine 10, including signals previously discussed and additionally including a measurement of inducted mass air flow (MAF) from a mass air flow sensor 122; an engine coolant temperature (ECT) from a temperature sensor 116 coupled to a cooling sleeve 118; an exhaust gas temperature from a temperature sensor 158 coupled to exhaust passage 148; a profile ignition pickup signal (PIP) from a Hall effect sensor 120 (or other type) coupled to crankshaft 140; throttle position (TP) from a throttle position sensor; signal EGO from exhaust gas sensor 128, which may be used by controller 12 to determine the AFR of the exhaust gas; and an absolute manifold pressure signal (MAP) from a MAP sensor 124. An engine speed signal, RPM, may be generated by controller 12 from signal PIP. The manifold pressure signal MAP from MAP sensor 124 may be used to provide an indication of vacuum or pressure in the intake manifold. Controller 12 may infer an engine temperature based on the engine coolant temperature and infer a temperature of catalyst 178 based on the signal received from temperature sensor 158.

Controller 12 receives signals from the various sensors of FIG. 1 and employs the various actuators of FIG. 1 to adjust engine operation based on the received signals and instructions stored on a memory of the controller. For example, upon receiving signals from various sensors, the engine controller may send control signals to an actuator to adjust a position of the wastegate 175, activate the e-booster 160, or other suitable action.

As described above, FIG. 1 shows only one cylinder of a multi-cylinder engine. As such, each cylinder may similarly include its own set of intake/exhaust valves, fuel injector(s), spark plug, etc. It will be appreciated that engine 10 may include any suitable number of cylinders, including 2, 3, 4, 5, 6, 8, 10, 12, or more cylinders. Further, each of these cylinders can include some or all of the various components described and depicted by FIG. 1 with reference to cylinder 14.

Referring now to FIG. 2, a schematic of a thermoelectric generator (TEG) 200 is shown. A TEG utilizes the Seebeck effect, a form of the thermoelectric effect, to produce electrical energy from a temperature differential. The TEG may include a hot side thermally insulating layer 216, which may act as a hot side heat exchanger, and a cold side thermally insulating layer 218, which may act as a cold side heat exchanger. Thermoelectric materials, such as n-doped semiconductors 202 and p-doped semiconductors 204, may be sandwiched between the hot side 216 and the cold side 218. In one example, the TEG 200 may also include a compression assembly system, which holds the TEG 200 together. The temperature difference between the hot side 216 and the cold side 218 creates an electric potential (e.g., a voltage) in the thermoelectric materials. The amount of voltage generated by a TEG corresponds to the difference in temperature between the hot side 216 and the cold side 218, which results in a relatively larger amount of electrical energy being generated if a TEG has a relatively large temperature difference between the hot side 216 and the cold side 218. In this example, the thermoelectric materials comprise of alternating n-doped semiconductors 202 and p-doped semiconductors 204 connected in a series such that the voltages across the thermoelectric materials are added to create a larger voltage between a negative end 210 and a positive end 212 of the TEG. One or more components, sensors, and/or batteries 214 may then be connected across the terminals 210, 212 to power one or more of the components and/or charge the battery 214. In one example, the electric motor 161 for electric compressor 160 of the upstream supercharger may be partially or fully powered by the electricity generated by the TEGs from the waste heat recovered by the TEGs on the exhaust housing. In such an example, a switch may be provided at a junction between an electrical conduit coupling the TEG(s) to a battery and electrical conduit coupled to the electric motor, or other suitable location. The switch may be adjusted to flow all the current from the TEGs to the battery, or to flow some or all of the current from the TEGs to the electric motor. It is to be understood that other circuity may be provided that is not shown in FIG. 2.

A current sensor 220 may be included in the TEG circuit to monitor the electric current generated by the TEG. Engine controller 12 may use the electric current sensor measurement to determine the electric power produced by the TEG and calculate temperature differences across the TEG. In one example, lead telluride (PbTe), which may be doped, may serve as the p-type semiconductor 204 and bismuth telluride ($Bi_2Te_3$) may serve as the n-type semiconductor 202. In other examples, other thermoelectric materials may be used, such as $Bi_2Se_3$ $Sb_2Te_3$, or other bismuth chalcogenides, inorganic clathrates ($Ba_8Ga_{16}Ge_{30}$, $Ba_8Ga_{16}Si_{30}$), magnesium group IV compounds ($Mg_2Si$, $Mg_2Ge$, $Mg_2Sn$), silicides, skutterudite thermoelectrics, oxide thermoelectrics, half Heusler alloys, silicon germanium, sodium cobaltate, tin selenide, and others.

TEG 200 may additionally serve as a temperature sensor in addition to an electric generator. Because the voltage and resulting electric current created by the TEG corresponds to the temperature difference between hot side 216 and cold side 218, the electric current measured by current sensor 220 may be correlated to a temperature difference across the TEG and in some examples, a temperature of one of the components coupled to the TEG (e.g., a compressor or turbine) if a temperature of the other component is known or estimated such as by using other temperature sensors (e.g., exhaust passage sensor 158) associated with engine 10. This allows the TEG to be utilized in temperature monitoring and diagnostics, in addition to waste heat recovery, for the turbocharger and e-booster systems.

Turning now to FIG. 3, a diagram of an example turbocharger system 300, with the compressor 174, intake air passage 142, connecting shaft 180, exhaust turbine 176, exhaust turbine heat shield 302, turbine wheel 308, and a plurality of TEGs 304 mounted to the heat shield is shown. Post-combustion exhaust gasses enter the exhaust turbine 176 from the exhaust passage 148 and turn turbine wheel 308, which rotates shaft 180 and compressor impeller 306 in order to power compressor 174. Fresh air (and EGR, fuel vapors, or other gases, depending on the configuration of the engine) enters the compressor 174 from the intake air passage 142 before it is compressed via the impeller 306 and sent towards intake passage 146 and cylinder 14 to be used for fuel combustion. Heat shield 302 may be comprised of a suitable insulating material, such as metal, silica, ceramic, or other material. Heat shield 302 may extend around turbine 176 in the manner shown, or may have another suitable shape, such as conforming to the housing of the turbine.

Further, in some examples, heat shield 302 may be dispensed with and the plurality of TEGs may be coupled directly to the turbine housing.

The TEGs 304 may be mounted between the compressor 174 and the exhaust turbine 176 with the TEG hot side 216 in contact with the heat shield 302. The cold side 218 of the TEGs may be in contact with the compressor 174 or the ambient air (e.g., the engine underhood air). In the configuration illustrated in FIG. 3, each TEG is coupled to an inner wall of the heat shield 302 that faces the compressor. The inner wall of the heat shield may represent the portion of the heat shield that is closest to the compressor. Remaining portions of the heat shield further from the heat shield, such as the top wall, bottom wall, etc., may not include any TEGs.

Each TEG shown in FIG. 3 may be a non-limiting example of TEG 200 of FIG. 2. As such, each TEG 304 may include at least one n-doped semiconductor and p-doped semiconductor pair coupled in series and electrically coupled to a component, such as a battery. Further, each TEG 304 may be coupled to a separate current sensor, a portion of the TEGs may be coupled to a common current sensor, or all the TEGs may be coupled to a single current sensor. As shown, a subset of the TEGs are directly coupled (e.g., in face-sharing contact) with both the turbine (e.g., the heat shield) and the compressor (e.g., the compressor housing) and the remaining TEGs are directly coupled to the turbine on the hot side and open to ambient on the cold side. However, other configurations are possible, such as all the TEGs being directly coupled to both the turbine and compressor, or all of the TEGs being coupled to only the turbine.

FIG. 3 shows nine separate TEG modules. However, the illustration of the TEG modules shown in FIG. 3 is exemplary and other configurations are possible. For example, other numbers of TEG modules may be coupled to the heat shield, such as four, six, or other suitable number of TEG modules. In other examples, only one TEG module may be coupled to the heat shield, but the TEG module may extend across a larger area of the surface of the heat shield (e.g., two or more of the separate modules shown in FIG. 3 may be combined into a larger single module). It is to be understood that the TEGs are shown in cross-section and that the TEGs may be extend along other axes not shown in FIG. 3. The TEGs may have a suitable size based on the size of the turbine, packaging constraints, etc. The TEGs may be mounted as a separate structure on the heat shield. In other examples, the TEGs may be integrated with the heat shield.

During vehicle operation, the exhaust turbine housing may reach a temperature between 750° C. and 800° C. while the engine underhood air and compressor may reach a temperature of around 100° C. Additionally, during vehicle operation, compressor 174 may receive lower temperature fresh air, which assists in maintaining a lower temperature in relation to the exhaust turbine 176. Arranging the TEGs between the compressor and exhaust turbine, which may have a minimum temperature differential of 650° C. during vehicle operation, may maximize the amount of waste heat recovered as electrical energy and allow the temperature difference between the compressor and exhaust turbine to be measured for monitoring and diagnostics of the turbocharger and e-booster systems.

Turning now to FIG. 4, another diagram of an example turbocharger system 400, with the compressor 174, intake air passage 142, connecting shaft 180, exhaust turbine 176, heat shield 302, turbine wheel 308, compressor impeller 306, and a plurality of TEGs 402 mounted to the heat shield is shown. Compared to the turbocharger system in FIG. 3, the cold side 218 of every TEG mounted on the heat shield 302 is in contact with the ambient air (e.g., engine underhood air). In addition, the TEGs are arranged on the heat shield such that the TEGs extend partially along the turbine housing. For example, as shown, a first portion of TEGs are positioned on the inner wall of the heat shield between the turbine and the compressor, a second portion of TEGs are positioned along a top wall of the heat shield, and a third portion of TEGs are positioned along the bottom wall of the heat shield. The TEGs that are positioned on the top and the bottom walls of the heat shield may cover only a portion of the top and bottom walls of the heat shield. For example, only 50% of the length of the top wall of the heat shield may include TEGs. The portions of the heat shield that extend along the turbine inlet 404 and turbine outlet 406 may not include TEGs in the example shown in FIG. 4. Further, one or more TEGs may be arranged along the turbine housing surrounding the shaft 180.

FIG. 5 shows another diagram of an example turbocharger system 500, with the compressor 174, intake air passage 142, connecting shaft 180, exhaust turbine 176, heat shield 302, compressor impeller 306, turbine wheel 308, and a plurality of TEGs 502 mounted the heat shield. Compared to the turbocharger systems in FIGS. 3-4, the TEGs extend across the entire heat shield 302, including portions of the heat shield that extend above/around the turbine inlet and outlet.

FIG. 6 shows an additional diagram of an example turbocharger system 600, with the compressor 174, intake air passage 142, connecting shaft 180, exhaust turbine 176, heat shield 302, compressor impeller 306, turbine wheel 308, and a plurality of TEGs 602 mounted the heat shield, where each TEG includes and one or more cooling fins 604. Compared to the turbocharger systems in FIGS. 3-5, the TEG cold sides 218 have thermally conductive cooling fins 604 affixed, serving as a heat sink by increasing surface area for heat transfer to the lower temperature engine underhood air. Using the thermally conductive cooling fans serves as an additional passive cooling mechanism for the cold side of the TEG, which assures the largest temperature difference between the TEG hot side 216 and the TEG cold side 218 is maintained.

In addition or alternative to thermally conductive cooling fins 604, additional cooling mechanisms may be utilized with the TEG cold sides 218 to maintain the largest temperature difference to extract waste heat and generate electrical energy. In one example, a water cooling system (not shown) may circulate coolant between the TEG cold sides 218 and a radiator (not shown). The water cooling system for the TEGs may be a dedicated system or part of the primary coolant system for vehicle engine 10.

Thus, FIGS. 3-6 show various examples of turbochargers including one or more TEGs coupled thereto. In the illustrated examples, the one or more TEGs may be coupled to a heat shield surrounding the turbine. However, in other examples, the one or more TEGs may be coupled to a housing of the turbine or other suitable component. The one or more TEGs may be positioned on suitable locations of the turbine based on the configuration of the turbocharger and current generation demand (e.g., how much current is to be generated by the TEGs). For example, a region of the turbocharger between the turbine and compressor housings (e.g., surrounding the turbocharger shaft) may undergo the highest temperature differential of any region of the turbocharger. Thus, as shown in FIG. 3, the one or more TEGs may be positioned on an inner wall of a heat shield, where the inner wall faces the compressor and is adjacent to and/or at least partially surrounds the turbocharger shaft. The TEGs positioned along the inner wall may be in face-sharing contact with the inner wall along a hot side of each TEG and may optionally be in face-sharing contact with a compressor component, such as the compressor housing, along a cold side of each TEG. In other examples, additional TEGs may be positioned along the top, bottom, and/or other regions of the heat shield or turbine housing. The selection of which regions of the heat shield or turbine housing are to include TEGs may be based on turbocharger packaging, cost, and the temperature differential at each location.

Referring now to FIG. 7A, a method 700 for monitoring turbocharger performance using an amount of current generated by one or more TEGs coupled to the turbocharger is shown. Method 700 may be carried out in an engine system, such as the system of FIG. 1, in order to monitor performance of a turbocharger, such as turbine 176 and compressor 174, a wastegate, such as wastegate 175, and/or an e-booster, such as electric compressor 160, based on the amount of current generated from one or more TEGs, such as TEG 200 of FIG. 2. Instructions for carrying out method 700 and the rest of the methods included herein may be executed by a controller, such as controller 12 of FIG. 1, based on instructions stored on a memory of the controller and in conjunction with signals received from sensors of the engine system, such as the current sensor described above with reference to FIG. 2. The controller may employ engine actuators of the engine system to adjust engine operation, according to the methods described below.

At 702, method 700 determines the operating parameters. The operating parameters may include current vehicle speed, engine speed, engine coolant temperature, engine running time, exhaust gas temperature, and/or other operating parameters. At 704, method 700 determines if conditions are met for monitoring the exhaust turbine of the turbocharger system. The conditions for monitoring the exhaust turbine may include engine coolant temperature being greater than a threshold temperature (e.g., such that engine temperature, and hence exhaust temperature, are high enough to generate a sufficient temperature differential between the compressor and turbine for generating current via the TEGs), time since an engine start being greater than a threshold time (which may also act as a proxy for indicating that turbine temperature is high enough to generate current via the TEGs), exhaust gas temperature being greater than a threshold, and/or engine speed and/or load being greater than a threshold. In some examples, the turbine monitoring may only be performed after a threshold duration (whether time or miles driven) has elapsed since a prior monitoring of the turbine was carried out. In still further examples, the turbine monitoring may be performed responsive to an indication that wastegate position sensor data and/or exhaust gas temperature data is unavailable. For example, if wastegate position is not able to be determined from the wastegate position sensor data (e.g., due to sensor degradation), functionality of the wastegate may be monitored based on the amount of current generated by the TEGs. If the conditions are met to monitor the exhaust turbine, the answer is yes and method 700 proceeds to 708. Otherwise, the answer is no and method 700 proceeds to 705.

At 705, method 700 determines if the conditions are met to monitor the compressor 174 of the turbocharger system. The conditions for monitoring the compressor may include the same conditions as discussed above for monitoring the turbine (e.g., sufficient exhaust temperature so that current may be generated by the TEGs). Further, in some examples, the conditions for monitoring the compressor may additionally or alternatively include ambient air temperature being below a threshold temperature, such as less than 100° F., such that the compressor and/or underhood are cold enough to generate sufficient current with the TEGs. Additionally or alternatively, the compressor may be monitored responsive to an indication that intake air temperature data (or other intake system data, such as compressor recirculation valve position data) is unavailable. Further, while FIG. 7A shows the compressor monitor only being carried out responsive to the conditions for monitoring the turbine not being met, it is to be understood that in some examples, the compressor monitor may be carried out independent of the turbine monitor (e.g., independent of whether or not the conditions for monitoring the turbine monitor at 704 were met) and/or that the turbine monitoring and compressor monitoring may be carried out simultaneously.

If the conditions for monitoring compressor 174 are met, the answer is yes and method 700 proceeds to 724 (shown in FIG. 7B). Otherwise, the answer is no and method 700 proceeds to 706. At 706, method 700 maintains current operating parameters of the vehicle. Maintaining current operating parameters may include flowing exhaust gas through the turbine and compressing fresh air via the compressor, adjusting a position of a wastegate coupled across the turbine based on exhaust gas mass flow, exhaust or turbine temperature, and/or engine load, and activating an e-booster (e.g., electric booster 160) to provide torque assist as commanded. The current operating parameters may further include generating current with the TEGs via a temperature differential across the TEGs, and flowing the current to a battery for storage and/or for driving the e-booster. Method 700 returns.

At 708, method 700 measures the electric current generated by the TEGs mounted on the exhaust turbine heat shield or housing. The electric current is measured by a current sensor, such as sensor 220 of FIG. 2, and the measured electric current value is sent to the controller. The measured electric current may be the current generated by each individual TEG, electric currents generated by clusters of several TEGs, or the total electric current from every TEG on the exhaust turbine.

At 710, method 700 determines if a change in wastegate position is commanded. The wastegate position may be commanded to change under high engine loads, when more exhaust gas is generated by the engine and the wastegate opens to allow excess exhaust gas to bypass the exhaust turbine. In other examples, the wastegate may be commanded to close if exhaust gas mass flow drops and/or an increase in boost pressure is demanded when the wastegate is open. If the wastegate position is commanded to change, the answer is yes and method 700 proceeds to 714. Otherwise, the answer is no and method 700 proceeds to 712.

At 712, method 700 continues to monitor the exhaust turbine temperature and performance via the generated TEG current. The temperature and performance of the exhaust turbine may be determined from measured TEG electric current by comparing the measured TEG electric current to a table of pre-determined electric currents for the exhaust turbine given current engine parameters. The relevant engine parameters may be the flow rates of exhaust and intake gas, engine coolant temperature, exhaust gas temperature, and/or the temperature of the compressor. If the measured TEG electric current is within a predetermined tolerance of the expected predetermined electric current, given the engine parameters, then exhaust turbine may be determined to be functional. Otherwise, if a discrepancy is observed between the expected and measured TEG electric current, potential degradation of the exhaust turbine (e.g., of the wastegate) and/or one or more TEGs may be present and the operator may be notified.

In other examples, the temperature of the turbine may be monitored via the current generated by the one or more TEGs. If the temperature of the turbine exceeds a threshold, the wastegate may be commanded to open to bypass exhaust gas around the turbine and avoid an over-temperature event that could lead to turbine degradation. To monitor the temperature of the turbine, the amount of current generated by the one or more TEGs may be measured and an estimated compressor and/or underhood temperature may be determined. A temperature differential across the TEGs may be determined from the amount of current generated by the TEGs, as the amount of current generated is proportional to the temperature differential. The estimated compressor and/or underhood temperature may then be subtracted from the temperature differential to calculate turbine temperature. In other examples, an upper limit amount of current generated by the TEGs may be calculated based on the estimated compressor and/or underhood temperature. The upper limit amount of current may reflect a tolerated difference between the compressor and/or underhood temperature and turbine temperature. If the amount of current generated by the one or more TEGs exceeds the upper limit, the turbine may be indicated as being at a high temperature that could lead to degradation and the wastegate may be commanded to open. The compressor temperature may be estimated based on intake air mass flow, boost pressure, ambient air temperature, and/or other parameters. Underhood temperature may be determined based on output from a temperature sensor positioned to measure underhood temperature, or the underhood temperature may be estimated based on engine temperature, ambient air temperature, vehicle speed, and/or other parameters. Method 700 returns.

At 714, method 700 measures the electric current after the change in wastegate position is commanded. Method 700 then proceeds to 716, where method 700 determines if an expected change in current is observed after the wastegate position change is commanded (e.g., upon the wastegate position changing). If the wastegate is commanded to open after being closed, less exhaust gas reaches exhaust turbine, which may cause the exhaust turbine to spin slower and decrease in temperature, and thus the TEGs may produce less electric current. Additionally, if the wastegate is commanded to close after being open, more exhaust gas reaches the exhaust turbine, which may cause the exhaust turbine to spin faster and increase in temperature, and thus the TEGs may produce more electric current. If the expected change in TEG electric current is observed within a predetermined tolerance, the answer is yes and method 700 proceeds to 720. Otherwise, the answer is no and method 700 proceeds to 718.

At 718, method 700 indicates that wastegate degradation may potentially be present. Method 700 then proceeds to 722, where the vehicle operator is notified of the potential degradation of wastegate. The vehicle operator may be notified by a set code leading to a "check engine" light, or a visual/audio chime. Further, a diagnostic code may be set. The operating parameters of the engine may also be adjusted to compensate for potential wastegate degradation. Operating parameters that may be adjusted may allow the engine to run in a lower power mode (e.g., engine torque may be limited) and produce less exhaust gases, such as retarding intake valve timing, restricting the degree of opening of the throttle valve, limiting fuel injection amounts, etc. Method 700 returns.

At 720, method 700 determines that the wastegate is functioning as expected, since at 716 the expected change in TEG electric current was observed within a predetermined tolerance. For example, if the wastegate is commanded to open from a fully closed position, turbine temperature may decrease and hence the amount of current generated by the TEGs may decreased. If the amount of current does decrease, the wastegate may be determined to be functional. Method 700 returns.

In some examples, the current sensor may be positioned to measure the overall amount of current generated by all the TEGs mounted to the turbocharger. However, in other examples, the current sensor may be positioned to measure the amount of current generated by only one or a subset of TEGs mounted to the turbocharger. For example, the current sensor may be positioned to measure only the amount of current generated by one or more of the TEGs that are mounted in a location where the compressor or underhood temperature is stable, consistent, and/or easy to estimate or measure. In this way, differences in the amount of current generated by the TEGs during vehicle operation may be more consistently attributed to changes in the turbine temperature, increasing the robustness of the turbine monitoring.

Turning now to FIG. 7B, method 700 continues from 705 to 724. At 724, method 700 measures the electric current generated by the TEGs mounted between the compressor and the exhaust turbine. The electric current is measured by a current sensor 220 and the measured electric current value is sent to controller 12. The measured electric current may be the current generated by each individual TEG, electric currents generated by clusters of several TEGs, or the total electric current from every TEG between the compressor and the exhaust turbine housing.

At 726, method 700 determines if the e-booster is commanded to operate. The e-booster may be commanded to operate under high engine loads, when more engine power is needed, and controller may send a command to activate the auxiliary e-booster (e.g., e-booster 160 driven by motor 161) to assist the compressor to compress additional intake air which is then provided to the cylinders for fuel combustion. If the e-booster is commanded to operate, the answer is yes and method 700 proceeds to 730. Otherwise, the answer is no and method 700 proceeds to 728.

At 728, method 700 continues to monitor the compressor temperature and performance via the generated TEG current between the exhaust turbine and the compressor. The temperature and performance of the compressor may be determined from measured TEG electric current by comparing the measured TEG electric current to a table of pre-determined electric currents for the TEGs between the compressor and exhaust turbine given current engine parameters. The relevant engine parameters may be the flow rates of exhaust and intake gas, engine coolant temperature, intake gas temperature, and/or the temperature of the exhaust turbine. If the measured TEG electric current is within a predetermined tolerance of the expected predetermined electric current, given the engine parameters, then the compressor may be determined to be functional. Otherwise, if a discrepancy is observed between the expected and measured TEG electric current, potential degradation of the compressor and/or one or more TEGs may be present and the operator may be notified. For example, if the compressor temperature is consistently higher than expected, it may be determined that a compressor recirculation valve is stuck open, resulting in recirculation of compressed air through the compressor, which may cause an increase in compressor temperature. Additional contributors to increased compressor temperature may include excess low-pressure EGR being provided to the intake upstream of the compressor, which may cause the compressor temperature to be higher than expected.

In other examples, the temperature of the compressor may be monitored via the current generated by the one or more TEGs. If the temperature of the compressor exceeds a threshold, one or more operating parameters may be adjusted to compensate for compressor temperature. For example, a charge air cooler downstream of the compressor may include a bypass valve configured to bypass intake air around the charge air cooler, thereby avoiding overcooling of the charge air and/or preventing build-up of condensation in the charge air cooler. If the temperature of the compressor exceeds a threshold, the bypass valve of the charge air cooler may be commanded to close to ensure all intake air passes through the charge air cooler. In other examples, the temperature of the compressor may be monitored to determine if condensation accumulation in the charge air cooler is likely. For example, if the temperature of the compressor is relatively low (e.g., lower than a second threshold), the bypass valve may be opened to bypass at least some air around the charge air cooler.

To monitor the temperature of the compressor, the amount of current generated by the one or more TEGs may be measured and an estimated turbine may be determined. A temperature differential across the TEGs may be determined from the amount of current generated by the TEGs, as the amount of current generated is proportional to the temperature differential. The estimated turbine temperature may then be subtracted from the temperature differential to calculate the compressor temperature. The turbine temperature may be measured from a temperature sensor, or the turbine temperature may be estimated based on engine load, exhaust gas mass flow, air-fuel ratio, turbine speed, and/or other parameters.

As explained above, the current sensor may be positioned to measure the overall amount of current generated by all the TEGs mounted to the turbocharger. However, in other examples, the current sensor may be positioned to measure the amount of current generated by only one or a subset of TEGs mounted to the turbocharger. For example, the current sensor may be positioned to measure only the amount of current generated by one or more of the TEGs that are in direct contact with the compressor housing. In this way, differences in the amount of current generated by the TEGs during vehicle operation may be more consistently attributed to changes in the compressor temperature, increasing the robustness of the compressor monitoring. Method 700 returns.

At 730, method 700 measures the electric current after the e-booster is commanded to operate. At 732, method 700 determines if an expected change in current is observed after the e-booster is commanded to operate. If the e-booster is commanded to operate, more air is compressed in intake air passage and subsequently in the compressor, which may cause the compressor to increase in temperature, lowering the temperature difference between the compressor and the exhaust turbine, and decreasing the measured TEG electric current. If the expected change in TEG electric current is observed within a predetermined tolerance, the answer is yes and method 700 proceeds to 736. Otherwise, the answer is no and method 700 proceeds to 734.

At 734, method 700 indicates that e-booster degradation may potentially be present. For example, if the e-booster is degraded and thus does not operate when commanded to operate, or if the e-booster operates but a lower load than commanded to operate at, the temperature of the compressor may remain relatively steady and the amount of current generated may not change. Thus, degradation of the e-booster may be indicated. Method 700 proceeds to 738, where the vehicle operator is notified of the potential degradation of the e-booster. The vehicle operator may be notified by a set code leading to a "check engine" light, or a visual/audio chime. Further, a diagnostic code indicating the e-booster is degraded may be set. The operating parameters of the engine may also be adjusted to compensate for potential e-booster degradation, such as limiting engine torque. Method 700 returns.

At 736, method 700 includes indicating that the e-booster is functioning as expected, since at 732 the expected change in TEG electric current was observed within a predetermined tolerance. For example, upon the command to operate the e-booster, the e-booster may operate at the commanded load, which may result in the temperature of the compressor increasing. The increase in compressor temperature may reduce the temperature differential across the TEGs, leading to a decrease in the amount of current generated by TEGs. Thus, if the amount of current generated by the one or more TEGs drops upon commanding the e-booster to operate, the e-booster may be indicated as being functional. Method 700 returns.

Figure 8:
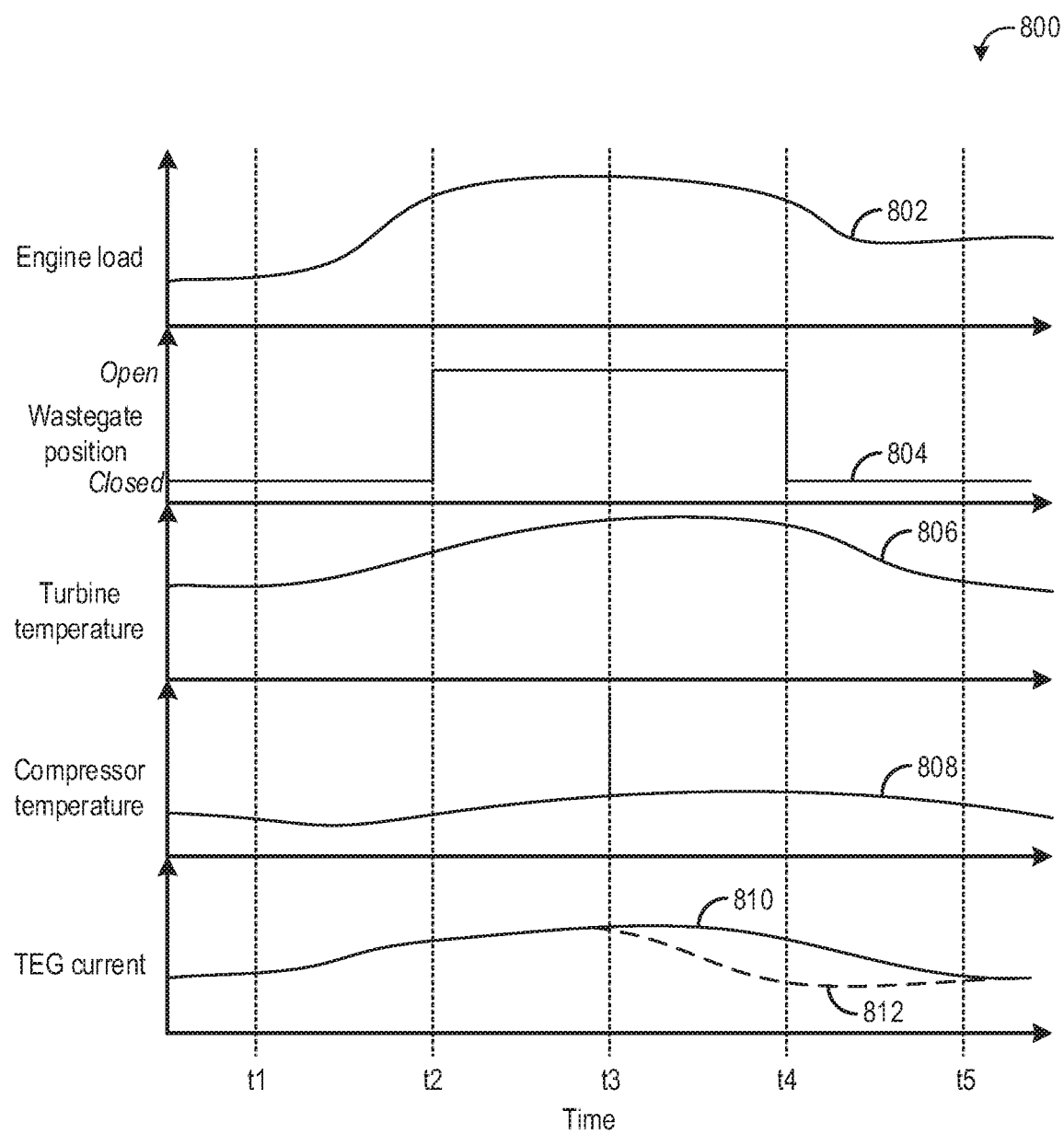
FIG. 8 is a timing diagram showing operating parameters that may be observed during the execution of the method illustrated in FIGS. 7A-7B.

FIG. 8 is a timing diagram 800 showing example operating parameters that may be observed during the execution of method 700, for example. A first plot from the top illustrates engine load, shown by curve 802. A second plot from the top illustrates commanded wastegate position, shown by curve 804. A third plot from the top illustrates estimated or measured turbine temperature, shown by curve 806. A fourth plot illustrates estimated or measure compressor temperature, shown by curve 808. A fifth plot illustrates TEG current as measured by a current sensor, shown by curve 810. An expected TEG current is shown by dashed line 812. Time is depicted along the x-axis. Respective values for each operating parameter are shown on the y-axes, increasing from a minimum value to a maximum value. Wastegate position is shown as either fully open or fully closed. Each plot is time-aligned and significant time points are depicted by dotted lines and labeled t1-t5.

Prior to time t1, engine load is relatively low (such as 30% of maximum rated load) and steady. Both turbine temperature and compressor temperature are steady. A sufficient temperature difference between the turbine and the compressor is present, and thus current is generated by the one or more TEGs. From time t1 to time t2, engine load increases. The increasing engine load results in an increase in exhaust gas mass flow. Further, exhaust temperature increases, causing an increase in turbine temperature while compressor temperature remains relatively steady. Thus, the amount of current generated by the TEGs also increases between t1 and t2.

At t2, due to the high engine load (which may be 90% of maximum load), the wastegate is commanded to open in order to bypass exhaust gas around the turbine. Between t2 and t3, the engine load remains high and wastegate is commanded open. However, in the example illustrated in FIG. 8, the wastegate is stuck closed and thus even though the wastegate is commanded open, the wastegate remains closed. From t2 to t3, turbine temperature continues to rise while compressor temperature remains steady. Thus, TEG current continues to rise. Likewise, between t3 and t4, engine load is high and the wastegate is still commanded open (though the wastegate is unable to open). Accordingly, turbine temperature does not decrease between t3 and t4 and thus the TEG current remains relatively high. In contrast, as shown by the dashed line 812, if the wastegate were able to open as commanded, by time t3 it may be expected that turbine temperature would begin to decrease, leading to a decrease in TEG current.

At t4, the amount of current generated by the TEGs may be compared to a threshold current. The threshold current may be the amount of current prior to commanding the wastegate open, such as the current at t2. As appreciated from FIG. 8, the amount of current at t4 is equal to the amount of current at t2. Thus, the wastegate may be indicated as being degraded (e.g., stuck closed), as the amount of current did not change by an expected amount. The expected amount of change in the current may be shown by line 812; for example, at t4, the expected current (if the wastegate were able to open) is less than the current at t2.

Responsive to determining that the wastegate is degraded, the wastegate may be maintained in the closed position and engine torque may be limited to reduce exhaust gas mass flow. As a result, engine load decreases between t4 and t5 and turbine temperature begins to decrease. Additionally, other parameters may be adjusted to lower turbine temperature, such as preventing or limiting rich air-fuel ratio excursions.

As appreciated from FIG. 8, the determination of turbine performance/wastegate functionality may be carried out after a commanded change in wastegate position. Because the turbine may retain heat for a prolonged period, the current may be measured only once the wastegate has been commanded open for a threshold amount of time (e.g., after a time delay shown in FIG. 8 from t3 to t4), to allow time for the turbine temperature to change upon the change in wastegate position.

Thus, the systems and methods disclosed herein provide for one or more thermoelectric generator modules to be mounted to a turbocharger. The one or more TEGs may be mounted to a heat shield surrounding the turbine, or the TEGs may be mounted directly to the turbine housing. Further, one or more of the TEGs may also be mounted directly (e.g., on an opposite side) to a compressor of the turbocharger. In this way, the TEGs may utilize the waste heat of the exhaust (in combination with the cooler compressor and surrounding environment of the vehicle underhood) to generate electricity that may be stored in a battery. The battery may then power vehicle electrical loads, such as the AC compressor, coolant pump, etc., or the battery may power the vehicle in an electric or hybrid configuration. In further examples, the electricity generated from the TEGs may be fed directly (e.g., without passing through a battery) to an e-booster (also referred to as an electric compressor) to provide additional compression/torque assist to the engine.

A typical turbocharger for automotive use may include a turbine housing that has approximate dimensions of 48.3 cm×6.4 cm (outer circumference×inner width) to 66 cm×9.5 cm, leading to a suitable area of 300-620 $cm^2$ of available surface area for generating energy. A 41 $cm^2$ TEG module can generate up to 12.3 W, so it may be dimensionally possible to manage an arrangement of 7 to 15 modules and generate more than 184 W, a potential that can be reused feeding the battery with a joule thief circuit. Further, the approach described herein may be beneficial when applied to a twin-turbo or dual-turbocharger configuration wherein two turbines (and in some configurations, two compressors) are present, and thus additional hot-side surface area is available to which TEGs may be mounted, potentially doubling the amount of electricity that may be generated relative to a single turbocharger configuration.

The technical effect of mounting one or more thermoelectric generators to a turbocharger is waste heat energy can be used to generate electrical energy. The turbocharger shield(s) composed of thermoelectric generators (TEGs) will be able to support the charging of the battery system for standard and hybrid vehicles. TE modules are easy to package and can adopt different shapes according to the packaging need, and no moving parts are required, so useful life of the shield is expected. Further, the engine operating point is not affected by the adoption of the TEGs and turbo-lag effect is expected to be reduced owing to the heat-insulating properties of the heat shield and TEGs. Additionally, the proposed shield does not include a separate cooling mechanism, hence, less complexity is disclosed.

An example provides a method including adjusting one or more engine operating parameters based on an amount of current generated from one or more thermoelectric generators coupled to a turbocharger. In a first example of the method, adjusting one or more engine operating parameters based on an amount of current generated from one or more thermoelectric generators comprises adjusting an engine torque limit based on an amount of current generated from one or more thermoelectric generators. In a second example of the method, which optionally includes the first example, adjusting an engine torque limit based on an amount of current generated from one or more thermoelectric generators comprises indicating degradation of a wastegate coupled across a turbine of the turbocharger based on the amount of current generated from the one or more thermoelectric generators, and adjusting the engine torque limit in response to the indication. In a third example of the method, which optionally includes one or both of the first and second examples, indicating degradation of a wastegate coupled across a turbine of the turbocharger based on the amount of current generated from the one or more thermoelectric generators comprises: measuring a first amount of current generated from the one or more thermoelectric generators while the wastegate is commanded to a first position; measuring a second amount of current generated from the one or more thermoelectric generators while the wastegate is commanded to a second position; and indicating degradation of the wastegate responsive to the first amount of current being within a threshold range of the second amount of current. In a fourth example of the method, which optionally includes one or more or each of the first through third examples, adjusting an engine torque limit based on an amount of current generated from one or more thermoelectric generators comprises indicating degradation of an electric booster coupled upstream of a compressor of the turbocharger based on the amount of current generated from the one or more thermoelectric generators, and adjusting the engine torque limit in response to the indication. In a fifth example of the method, which optionally includes one or more or each of the first through fourth examples, indicating degradation of the electric booster based on the amount of current generated from the one or more thermoelectric generators comprises: measuring a first amount of current generated from the one or more thermoelectric generators while the electric booster is deactivated; measuring a second amount of current generated from the one or more thermoelectric generators while the electric booster is commanded to operate at a given load; and indicating degradation of the electric booster responsive to the first amount of current being within a threshold range of the second amount of current. In a sixth example of the method, which optionally includes one or more or each of the first through fifth examples, adjusting one or more engine operating parameters based on an amount of current generated from one or more thermoelectric generators includes adjusting a position of a wastegate coupled across a turbine of the turbocharger based on the amount of current generated by the one or more thermoelectric generators. In a seventh example of the method, which optionally includes one or more or each of the first through sixth examples, adjusting a position of a wastegate coupled across a turbine of the turbocharger based on the amount of current generated by the one or more thermoelectric generators comprises opening the wastegate responsive to the amount of current generated by the one or more thermoelectric generators exceeding a threshold amount. In an eighth example of the method, which optionally includes one or more or each of the first through seventh examples, the method further includes flowing current generated by the one or more thermoelectric generators to a battery.

An example provides for a system, including: a turbocharger comprising a turbine coupled to a compressor via a shaft, the turbine housed in a turbine housing and the compressor housed in a compressor housing; a plurality of thermoelectric generators coupled to the turbocharger, at least a subset of the plurality of thermoelectric generators coupled between the turbine housing and the compressor housing; and an electric booster electrically coupled to the plurality of thermoelectric generators. In a first example of the system, the plurality of thermoelectric generators are coupled directly to the turbine housing. In a second example of the system, which optionally includes the first example, each thermoelectric generator of the plurality of thermoelectric generators comprises a hot side and a cold side, each hot side directly coupled to the turbine housing. In a third example of the system, which optionally includes one or both of the first and second examples, the at least a subset of the plurality of thermoelectric generators is coupled to the compressor housing via respective cold sides. In a fourth example of the system, which optionally includes one or more or each of the first through third examples, the system further includes a heat shield surrounding the turbine housing, and the plurality of thermoelectric generators are coupled to the heat shield. In a fifth example of the system, which optionally includes one or more or each of the first through fourth examples, a first subset of the plurality of thermoelectric generators are coupled between the turbine housing and the compressor housing, and a second subset of the plurality of thermoelectric generators are coupled to the turbine housing in one or more regions extending around an exhaust inlet and/or an exhaust outlet of the turbine. In a sixth example of the system, which optionally includes one or more or each of the first through fifth examples, the system further includes a current sensor configured to measure an amount of current generated by the plurality of thermoelectric generators. In a seventh example of the system, which optionally includes one or more or each of the first through sixth examples, the turbocharger is coupled to an engine and the system further includes a controller storing instructions in non-transitory memory, the instructions executable by the controller to adjust one or more engine operating parameters based on the amount of current generated by the plurality of thermoelectric generators.

Another example provides for a method including generating current from one or more thermoelectric generators coupled to a turbocharger of a vehicle, the turbocharger fluidly coupled to an engine; selectively flowing the current to an electric motor to drive an electric compressor coupled in an intake passage upstream of a compressor of the turbocharger; and adjusting one or more engine operating parameters based on a measured amount of the current generated by the one or more thermoelectric generators relative to an estimated amount of current. In a first example of the method, the estimated amount of current is based on an estimated temperature differential across the one or more thermoelectric generators, the estimated temperature differential based on one or more of a previous measured amount of current generated by the one or more thermoelectric generators, intake air mass flow, exhaust gas mass flow, intake air temperature, exhaust gas temperature, turbine speed, electric compressor load, boost pressure, and underhood temperature. In a second example of the method, which optionally includes the first example, adjusting the one or more engine operating parameters based on the measured amount of current relative to the estimated amount comprises, upon a command to operate the electric compressor at a threshold load, limiting engine torque responsive to the measured amount of current being less than the estimated amount of current by a threshold amount.

Note that the example control and estimation routines included herein can be used with various engine and/or vehicle system configurations. The control methods and routines disclosed herein may be stored as executable instructions in non-transitory memory and may be carried out by the control system including the controller in combination with the various sensors, actuators, and other engine hardware. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example embodiments described herein, but is provided for ease of illustration and description. One or more of the illustrated actions, operations and/or functions may be repeatedly performed depending on the particular strategy being used. Further, the described actions, operations and/or functions may graphically represent code to be programmed into non-transitory memory of the computer readable storage medium in the engine control system, where the described actions are carried out by executing the instructions in a system including the various engine hardware components in combination with the electronic controller.

It will be appreciated that the configurations and routines disclosed herein are exemplary in nature, and that these specific embodiments are not to be considered in a limiting sense, because numerous variations are possible. For example, the above technology can be applied to V-6, I-4, I-6, V-12, opposed 4, and other engine types. The subject matter of the present disclosure includes all novel and non-obvious combinations and sub-combinations of the various systems and configurations, and other features, functions, and/or properties disclosed herein.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method for an engine with a turbine, comprising:
commanding adjustment of a turbocharger wastegate coupled across the turbine;
indicating degradation of the wastegate based on an amount of current generated from one or more thermoelectric generators coupled to a turbocharger during the commanded adjustment of the wastegate; and
adjusting an engine torque limit in response to the indication of wastegate degradation.

2. The method of claim 1, wherein indicating degradation of the wastegate coupled across the turbine of the turbocharger based on the amount of current generated from the one or more thermoelectric generators comprises:
measuring a first amount of current generated from the one or more thermoelectric generators while the wastegate is commanded to a first position;
measuring a second amount of current generated from the one or more thermoelectric generators while the wastegate is commanded to a second position; and
indicating degradation of the wastegate responsive to the first amount of current being within a threshold range of the second amount of current.

3. The method of claim 1, wherein adjusting the engine torque limit based on the amount of current generated from the one or more thermoelectric generators comprises indicating degradation of an electric booster coupled upstream of a compressor of the turbocharger based on the amount of current generated from the one or more thermoelectric generators, and adjusting the engine torque limit in response to the indication.

4. The method of claim 3, wherein indicating degradation of the electric booster based on the amount of current generated from the one or more thermoelectric generators comprises:
measuring a first amount of current generated from the one or more thermoelectric generators while the electric booster is deactivated;
measuring a second amount of current generated from the one or more thermoelectric generators while the electric booster is commanded to operate at a given load; and
indicating degradation of the electric booster responsive to the first amount of current being within a threshold range of the second amount of current.

5. The method of claim 1, wherein adjusting one or more engine operating parameters based on the amount of current generated from the one or more thermoelectric generators comprises adjusting a position of the wastegate coupled across the turbine of the turbocharger based on the amount of current generated by the one or more thermoelectric generators.

6. The method of claim 5, wherein adjusting the position of the wastegate coupled across the turbine of the turbocharger based on the amount of current generated by the one or more thermoelectric generators comprises opening the wastegate responsive to the amount of current generated by the one or more thermoelectric generators exceeding a threshold amount.

7. The method of claim 1, further comprising flowing current generated by the one or more thermoelectric generators to a battery.

8. A system, comprising:
a turbocharger comprising a turbine coupled to a compressor via a shaft, the turbine housed in a turbine housing and the compressor housed in a compressor housing;
a plurality of thermoelectric generators coupled to the turbocharger, at least a subset of the plurality of thermoelectric generators coupled between the turbine housing and the compressor housing;
an electric booster electrically coupled to the plurality of thermoelectric generators; and
wherein the turbocharger is coupled to an engine and further comprising a controller storing instructions in non-transitory memory, the instructions executable by the controller to command adjustment of a turbocharger wastegate coupled across the turbine; indicate degradation of the wastegate based on an amount of current generated from the plurality of thermoelectric generators coupled to the turbocharger during the commanded adjustment of the wastegate; and adjust an engine torque limit in response to the indication of wastegate degradation.

9. The system of claim 8, wherein the plurality of thermoelectric generators is coupled directly to the turbine housing.

10. The system of claim 9, wherein each thermoelectric generator of the plurality of thermoelectric generators comprises a hot side and a cold side, each hot side directly coupled to the turbine housing.

11. The system of claim 10, wherein at least the subset of the plurality of thermoelectric generators is coupled to the compressor housing via respective cold sides.

12. The system of claim 8, further comprising a heat shield surrounding the turbine housing, and wherein the plurality of thermoelectric generators is coupled to the heat shield.

13. The system of claim 8, wherein a first subset of the plurality of thermoelectric generators is coupled between the turbine housing and the compressor housing, and wherein a second subset of the plurality of thermoelectric generators is coupled to the turbine housing in one or more regions extending around an exhaust inlet and/or an exhaust outlet of the turbine.

14. The system of claim 8, further comprising a current sensor configured to measure the amount of current generated by the plurality of thermoelectric generators.

15. A method, comprising:
generating current from one or more thermoelectric generators coupled to a turbocharger of a vehicle, the turbocharger fluidly coupled to an engine;
selectively flowing the current to an electric motor to drive an electric compressor coupled in an intake passage upstream of a compressor of the turbocharger; and
adjusting one or more engine operating parameters based on a measured amount of the current generated by the one or more thermoelectric generators relative to an estimated amount of current.

16. The method of claim 15, wherein the estimated amount of current is based on an estimated temperature differential across the one or more thermoelectric generators, the estimated temperature differential based on one or more of a previous measured amount of current generated by the one or more thermoelectric generators, intake air mass flow, exhaust gas mass flow, intake air temperature, exhaust gas temperature, turbine speed, electric compressor load, boost pressure, and underhood temperature.

17. The method of claim 16, wherein adjusting the one or more engine operating parameters based on the measured amount of current relative to the estimated amount comprises, upon a command to operate the electric compressor at a threshold load, limiting engine torque responsive to the measured amount of current being less than the estimated amount of current by a threshold amount.

\* \* \* \* \*